US010371599B2

(12) United States Patent
Gathman et al.

(10) Patent No.: US 10,371,599 B2
(45) Date of Patent: Aug. 6, 2019

(54) ELECTRICAL TESTING SYSTEM AND METHOD

(71) Applicant: Auto Meter Products, Inc., Sycamore, IL (US)

(72) Inventors: Michael R. Gathman, Genoa, IL (US);
John C. McMillion, Oswego, IL (US);
Douglas W. Adams, DeKalb, IL (US);
Scott R. Crerar, South Elgin, IL (US);
Gary Humbert, Geneva, IL (US);
Jeffrey L. Hauman, DeKalb, IL (US);
John P. Leahy, Genoa, IL (US)

(73) Assignee: Auto Meter Products, Inc., Sycamore, IL (US)

( * ) Notice: Subject to any disclaimer, the term of this patent is extended or adjusted under 35 U.S.C. 154(b) by 92 days.

(21) Appl. No.: 15/513,095

(22) PCT Filed: Oct. 30, 2015

(86) PCT No.: PCT/US2015/058445
§ 371 (c)(1),
(2) Date: Mar. 21, 2017

(87) PCT Pub. No.: WO2016/070116
PCT Pub. Date: May 6, 2016

(65) Prior Publication Data
US 2017/0299465 A1 Oct. 19, 2017

Related U.S. Application Data

(60) Provisional application No. 62/073,930, filed on Oct. 31, 2014.

(51) Int. Cl.
*G01M 15/04* (2006.01)
*G01M 15/02* (2006.01)
(Continued)

(52) U.S. Cl.
CPC .......... *G01M 15/046* (2013.01); *G01M 15/02* (2013.01); *G01M 15/04* (2013.01);
(Continued)

(58) Field of Classification Search
CPC .. G01M 15/046; G01M 15/02; G01M 15/042; G01M 15/04; G01R 31/44; G01R 31/00
See application file for complete search history.

(56) References Cited

U.S. PATENT DOCUMENTS 4,050,297 A 9/1977 Pettingell et al.
4,418,388 A 11/1983 Allgor et al.
(Continued)

OTHER PUBLICATIONS

PCT International Search Report and Written Opinion of the International Searching Authority dated Jan. 20, 2016 for International Application No. PCT/US2015/058445 (14 pages).

*Primary Examiner* — Freddie Kirkland, III
(74) *Attorney, Agent, or Firm* — Fitch, Even, Tabin & Flannery, LLP

(57) ABSTRACT

A method and system for measuring, determining and/or analyzing the cranking RPM of a vehicle is provided. The system measures the voltage of at least a portion of a vehicle's electrical system to determine high and/or low voltage time periods during at least a portion of a starting or cranking cycle. The time between high and/or low voltage points can then be used, along with the number of cylinders in the vehicle, to determine the cranking RPM of the vehicle. The system may include a load module and a control module that are removably coupled to one another in first and second configurations.

19 Claims, 19 Drawing Sheets

(51) Int. Cl.
*G01R 31/00* (2006.01)
*G01R 31/44* (2006.01)
(52) U.S. Cl.
CPC .......... *G01M 15/042* (2013.01); *G01R 31/00* (2013.01); *G01R 31/44* (2013.01)

(56) References Cited

U.S. PATENT DOCUMENTS

| | | |
|---|---|---|
| 5,585,717 A | 12/1996 | Eriksson et al. |
| 6,061,638 A | 5/2000 | Joyce |
| 6,359,442 B1 | 3/2002 | Henningson et al. |
| 6,696,842 B2 * | 2/2004 | Traub .................. G01R 31/362 |
| | | 324/426 |
| 6,771,073 B2 | 8/2004 | Henningson et al. |
| 7,736,201 B2 | 6/2010 | Gathman et al. |
| 7,990,155 B2 | 8/2011 | Henningson |
| 8,823,381 B2 | 9/2014 | Henningson et al. |
| 2014/0277918 A1 | 9/2014 | Kim |

* cited by examiner

ELECTRICAL TESTING SYSTEM AND METHOD

CROSS-REFERENCE TO RELATED APPLICATION

This application is a U.S. national phase application filed under 35 U.S.C. § 371 of International Application Number PCT/US2015/058445, filed Oct. 30, 2015, designating the United States, which claims benefit of U.S. Provisional Application No. 62/073,930, filed Oct. 31, 2014.

FIELD

The present application generally relates to vehicle testing systems and, more particularly, to testing systems for analyzing vehicles and batteries such as by measuring voltage and determining cranking revolutions per minute (RPM) of a vehicle.

BACKGROUND

Battery voltage testing systems are generally known and have been used to test and determine the performance of batteries, such as batteries used in vehicles. Further, such systems can be used to analyze the performance of other aspects of a vehicle's electrical system, such as the starting and charging systems.

To properly test the cables and the connections, voltage drops must be measured in the presence of a flowing current and calculations made based thereon using Ohm's Law. Voltage drop measurements under conditions of intermittent current have traditionally been tested by using a variable load tester having an auxiliary voltmeter. The variable load tester has typically been connected at the starter (or alternator) and auxiliary volt leads of the tester connected at the battery.

In such a procedure an operator applies and adjusts the current using the variable load tester. While current flows, the operator notes the voltage at the starter (or alternator), and also notes the voltage at the battery. The operator then subtracts one voltage from the other to obtain the voltage drop of the electrical system. If the voltage drop exceeds a specified amount (typically 0.5 volts), the electrical system is deemed problematic and the operator determines if the problem is in a positive leg or in a negative leg of the electrical system.

This determination is typically made by reconnecting the auxiliary volt leads to measure a voltage drop across the positive leg. The operator then applies and adjusts the load and notes the voltage across the positive leg. The voltage drop cannot exceed one half of a maximal acceptable amount (e.g., 0.25 volts). A value exceeding one half of the maximal acceptable amount indicates a possible defect in the positive leg. To measure the voltage drop across a negative leg of the system, the auxiliary volt leads are moved to the negative leg. A load is applied and adjusted and the voltage drop across the negative leg is measured. A value exceeding one half of the maximal acceptable amount (e.g., 0.25 volts) indicates a possible defect in the negative leg.

Other variations of the aforementioned procedure, in which voltage drops are tested in an electrical system, have been attempted. For example, an inductive current probe can be used to measure the current in the system and a variable load tester can be added to supplement the system load if needed. The operator is thereby allowed to connect the variable load tester at the battery; however, the operator is still required to perform multiple procedures and keep track of and subtract a series of voltages from one another. In addition, such approaches to testing voltage drops in an electrical system require the operator to perform multiple setups to completely test the positive and negative legs of the system.

Because voltage drop tests are so difficult to perform and require a significant amount of knowledge and skill by the operator, they are rarely performed. Often the battery, starter, or alternator is unnecessarily replaced, resulting in operations that fail to solve the underlying problem.

The cranking RPM of a vehicle can oftentimes be used as an indicator of potential problems with various aspects of a vehicle. For example, a low cranking RPM for a vehicle may be indicative of problems with one or more of the battery, electrical system, starting system, starter motor, and/or engine condition. However, measuring the cranking RPM for a vehicle has been difficult. Furthermore, information about the cranking RPM may be used in combination with other information about the vehicle to help diagnose one or more problems or potential problems with different aspects of the vehicle.

SUMMARY

Generally speaking, and pursuant to the various embodiments described, methods and systems for measuring and determining cranking RPM of a vehicle are provided. In one example, the method includes measuring voltage of a portion of an electrical system of the vehicle during at least a portion of a starting cycle. In one or more computing devices, a first extreme voltage point of the portion of the electrical system is determined after the starting cycle has begun to designate a first reference time, and a second extreme voltage point of the portion of the electrical system is determined after the first reference time to create a second reference time. An amount of time between the first and second reference times is determined. The one or more computing devices further determine a number of compression strokes per minute based on the amount of time between the first and second reference times and determine the cranking RPM of the vehicle based on the number of compression strokes per minute and number of cylinders in the vehicle.

According to one form, the voltage is measured at a sampling rate of at least about 100 samples per second or one sample per 10 milliseconds. In other approaches, the sampling rate is in a range of about 1 to about 50 milliseconds.

In one application, the voltage is measured at a load module and the determining steps are performed in a control module physically disconnected from and located remotely from the load module.

The load module and control module may be wirelessly coupled to one another to transfer data therebetween.

One exemplary system for analyzing cranking RPM includes a load module, electrical leads and a control module. The electrical leads are coupled to the load module and extend therefrom for coupling to at least a portion of an electrical system of the vehicle. The control module is coupled to the load module for transmitting data therebetween. The control module is physically coupled to the load module in a first configuration and physically disconnected from the load module in a second configuration. For example, the control module and load module can be wirelessly coupled to one another to transmit data therebetween, for instance, via at least one of Wi-Fi, Bluetooth, infrared, USB, RFID, and the like. The control module and load module can transmit data therebetween when in either of the first and second configurations. At least one of the load module or the control module performs the steps above to determine the cranking RPM of the vehicle based on the number of compression strokes per minute and number of cylinders in the vehicle.

In one form, the system further includes a computing device located remotely from both of the load module and control module, wherein at least one of the load module and control module is configured to transmit data to the computing device for analyzing.

In accordance with another approach, a system for analyzing cranking RPM of a vehicle includes a testing system and a computing device. The testing system is configured to be coupled to at least a portion of an electrical system of the vehicle. The testing system measures voltage of the portion of the electrical system during at least a portion of a starting cycle of the vehicle. The testing system determines a first extreme voltage point of the portion of the electrical system after the starting cycle has begun to designate a first reference time. The testing system also determines a second extreme voltage point of the portion of the electrical system after the first reference time to create a second reference time so as to determine an amount of time between the first and second reference times. The testing system can then determine a number of compression strokes per minute based on the amount of time between the first and second reference times. The testing system determines the cranking RPM of the vehicle based on the number of compression strokes per minute and number of cylinders in the vehicle. Optionally, the testing system includes a load module and a control module, the control module being separable from the load module. The computing device is located remotely from the testing system and is configured to receive data from the testing system indicative of the cranking RPM of the vehicle. The computing device compiles the data from the testing system indicative of the cranking RPM of the vehicle to provide along with data from other vehicles indicative of the cranking RPM of the other vehicles.

According to one form, the testing system is further configured to measure and transmit data to the computing device concerning at least one of a battery test, charging system test, and a starting system test on the vehicle.

Optionally, the system further includes a plurality of testing systems. In this approach, the computing device is configured to receive data from the plurality of testing systems and compile data on a plurality of vehicles from the plurality of testing systems.

So configured, the system and method may be configured to permit an operator to test various aspects of a vehicle while being located remote from the load device. Further, the system and method may be suitable for testing and analyzing a vehicle's cranking RPM, which may be used alone or in combination with other tests to test and diagnose a vehicle's status and performance.

These and other aspects may be understood more readily from the following description and the appended drawings.

BRIEF DESCRIPTION OF THE DRAWINGS

For the purpose of facilitating an understanding of the subject matter sought to be protected, there are illustrated in the accompanying drawings embodiments thereof, from an inspection of which, when considered in connection with the following description, the subject matter sought to be protected, its construction and operation, and many of its advantages should be readily understood and appreciated.

DETAILED DESCRIPTION

Figure 1:
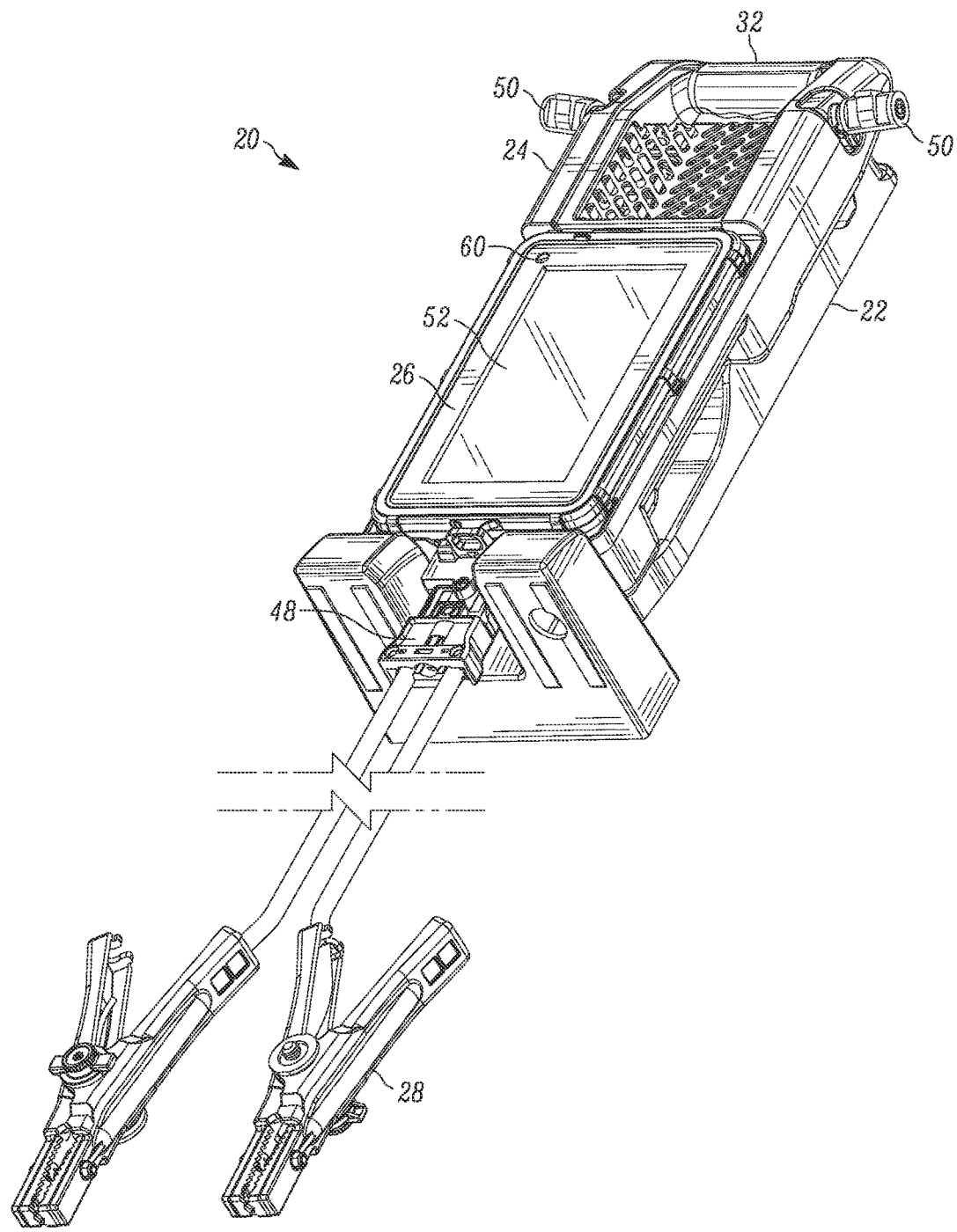
FIG. 1 is a front perspective view of a testing system used for analyzing a vehicle, the system including a charging station.
Figure 2:
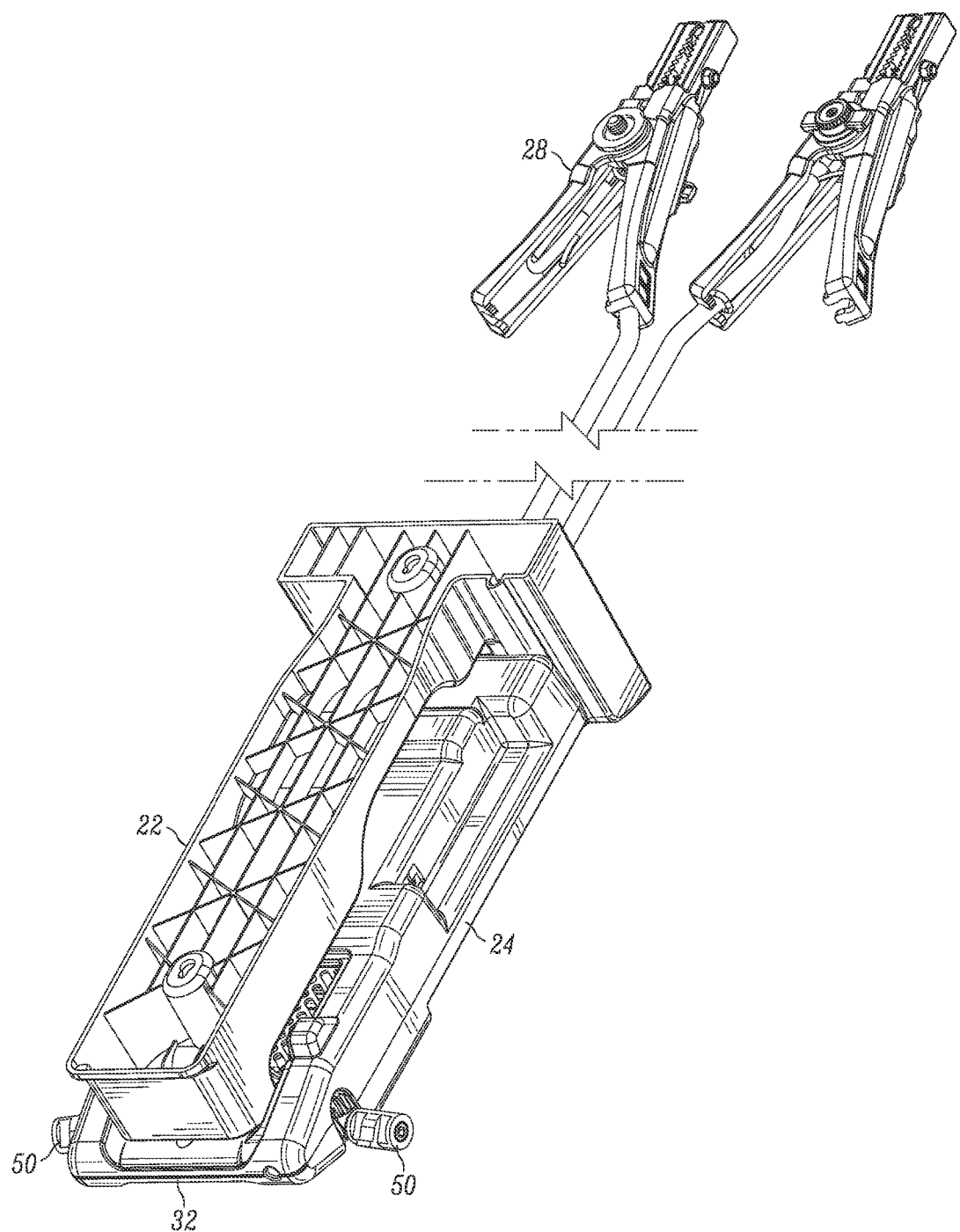
FIG. 2 is a rear perspective view of the system of FIG. 1.
Figure 3:
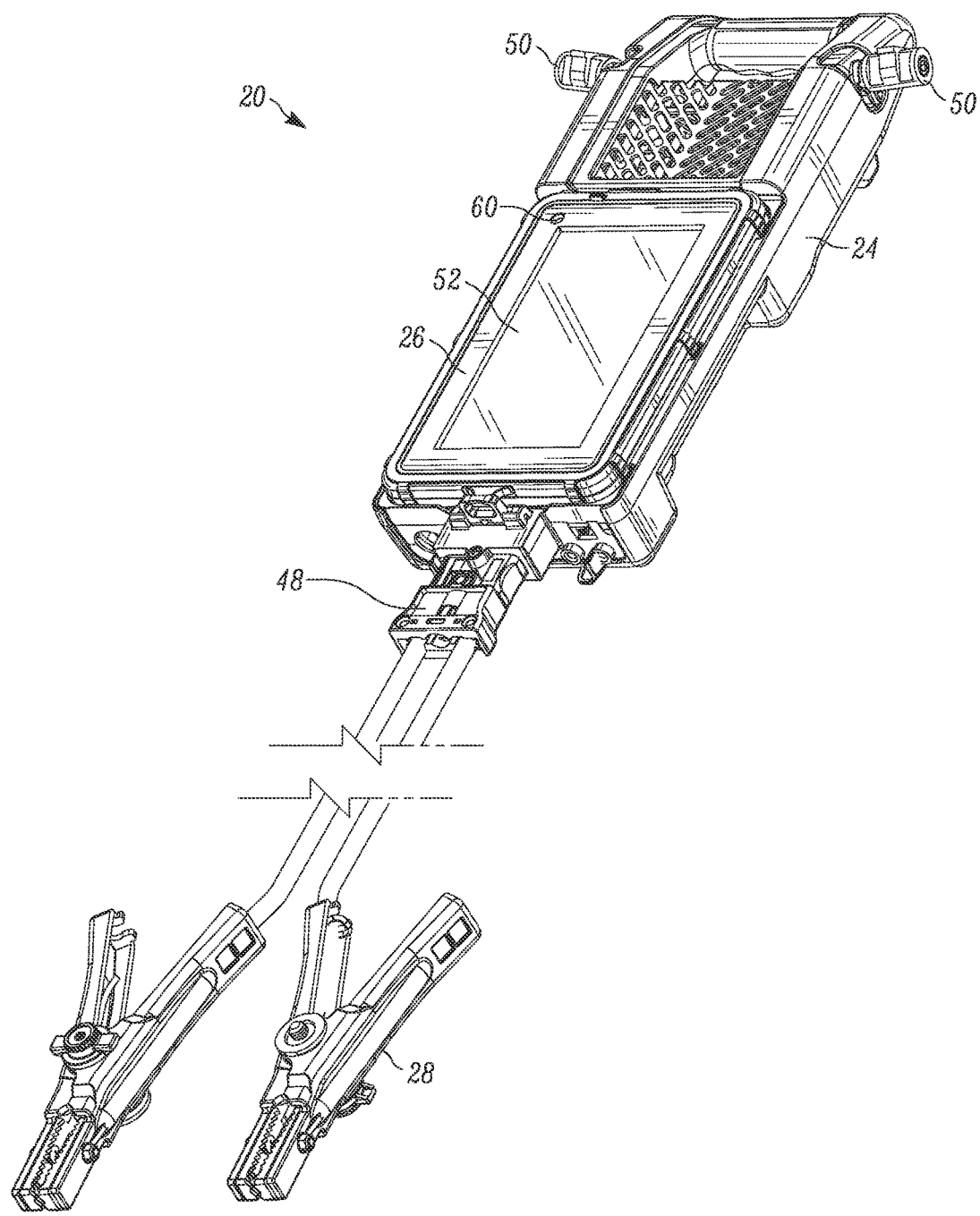
FIG. 3 is a front perspective view of the system of FIG. 1 removed from the charging station.
Figure 4:
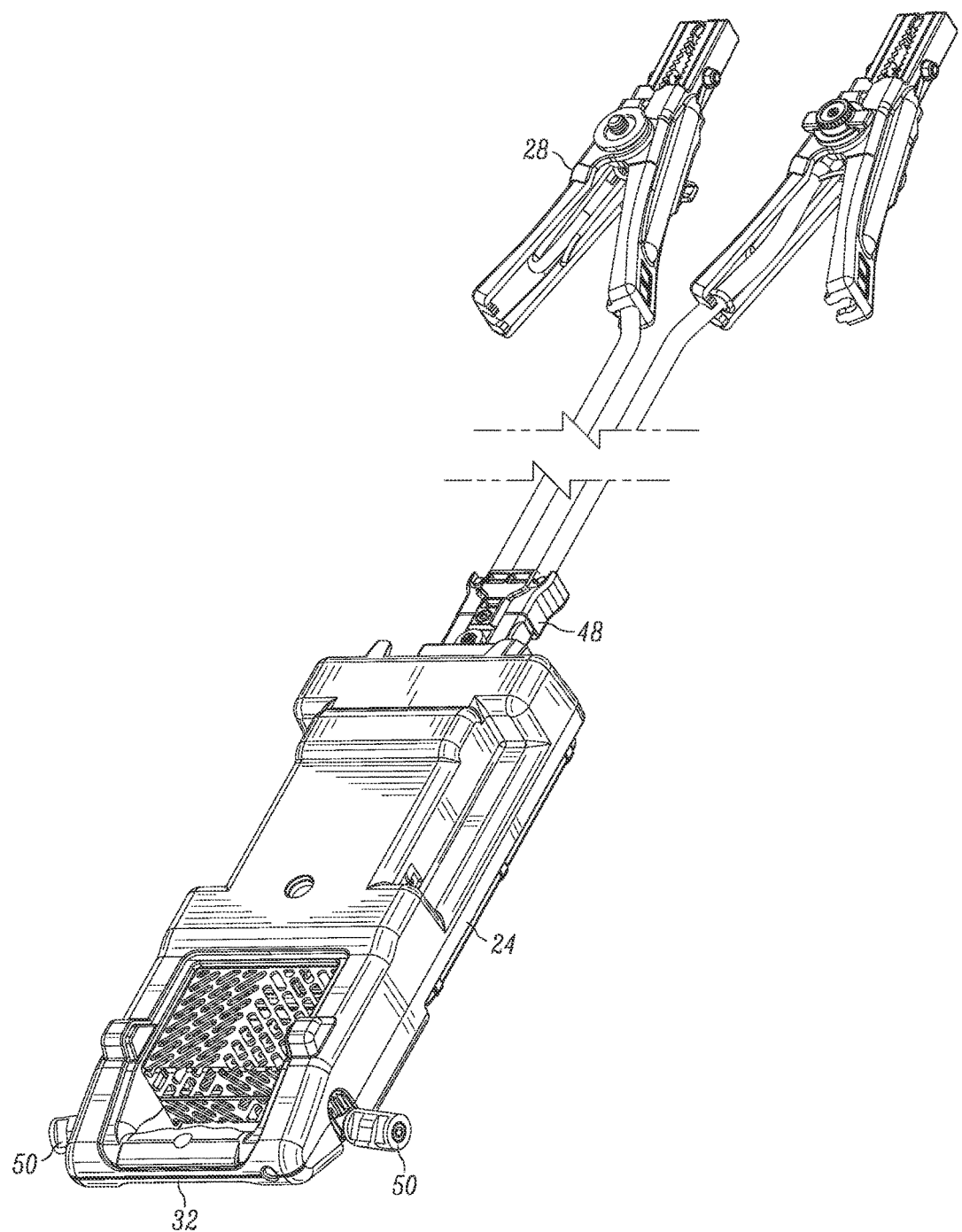
FIG. 4 is a rear perspective view of the system of FIG. 3.

Referring to FIG. 1, there is illustrated a testing system 20, which includes a charging station or cradle 22 (such as a docking station), a load module 24 and a control module 26. In one form, and in some of the figures, the testing system 20, which may include at least one of the charging station 22, load module 24 and control module 26, may be represented by the designator BV A-460.

As illustrated in the example of FIG. 1, the testing system 20 may be in the form of a handheld system for testing a battery, starting system, charging system, engine condition, and/or electrical system in automotive, truck, heavy duty vehicle, and other vehicle maintenance. Such a system may be used by an individual, professional, chain, and retail garage for testing a variety of aspects of the electrical and starting systems of vehicles.

The testing system 20 can be used to perform a variety of tests on a vehicle's battery, electrical system, charging system, starter, alternator and the like. Exemplary tests, procedures, and determinations are outlined in U.S. Pat. Nos. 6,061,638; 6,359,442; 6,771,073; 7,736,201; 7,990,155; and 8,823,381. Further tests that can be performed using the testing system include cranking RPM measurement and determination, as will be discussed in more detail below.

Figure 5:
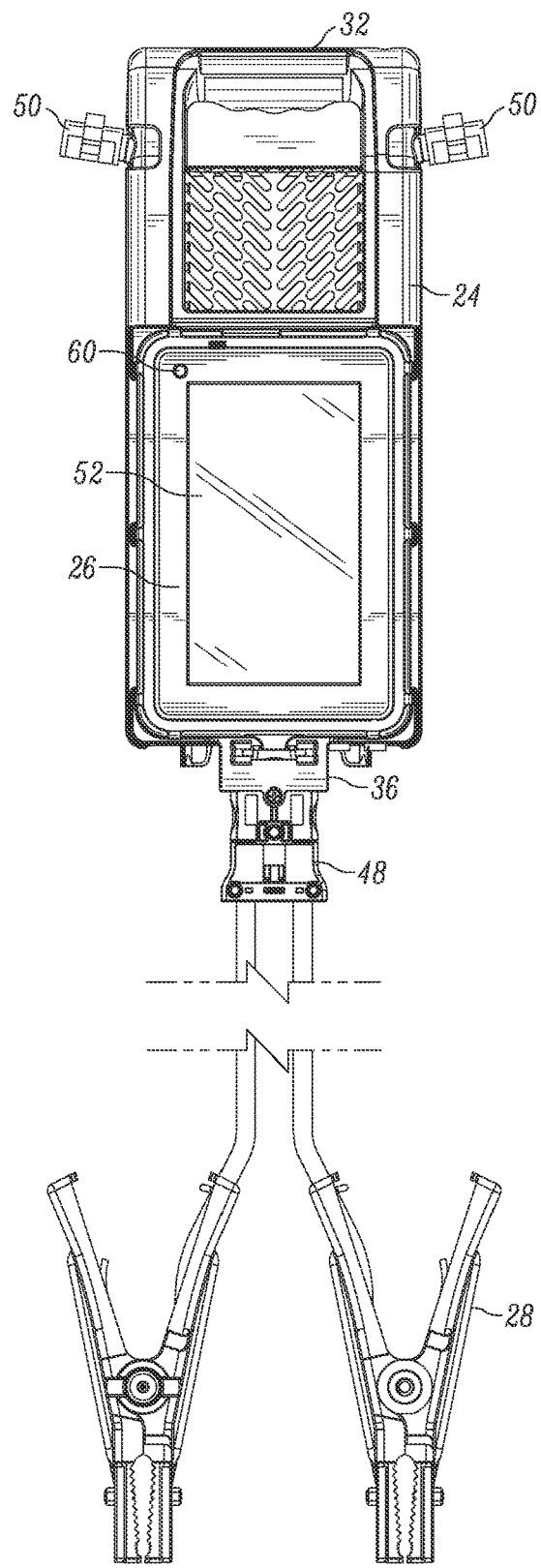
FIG. 5 is a front plan view of the system of FIG. 3.
Figure 6:
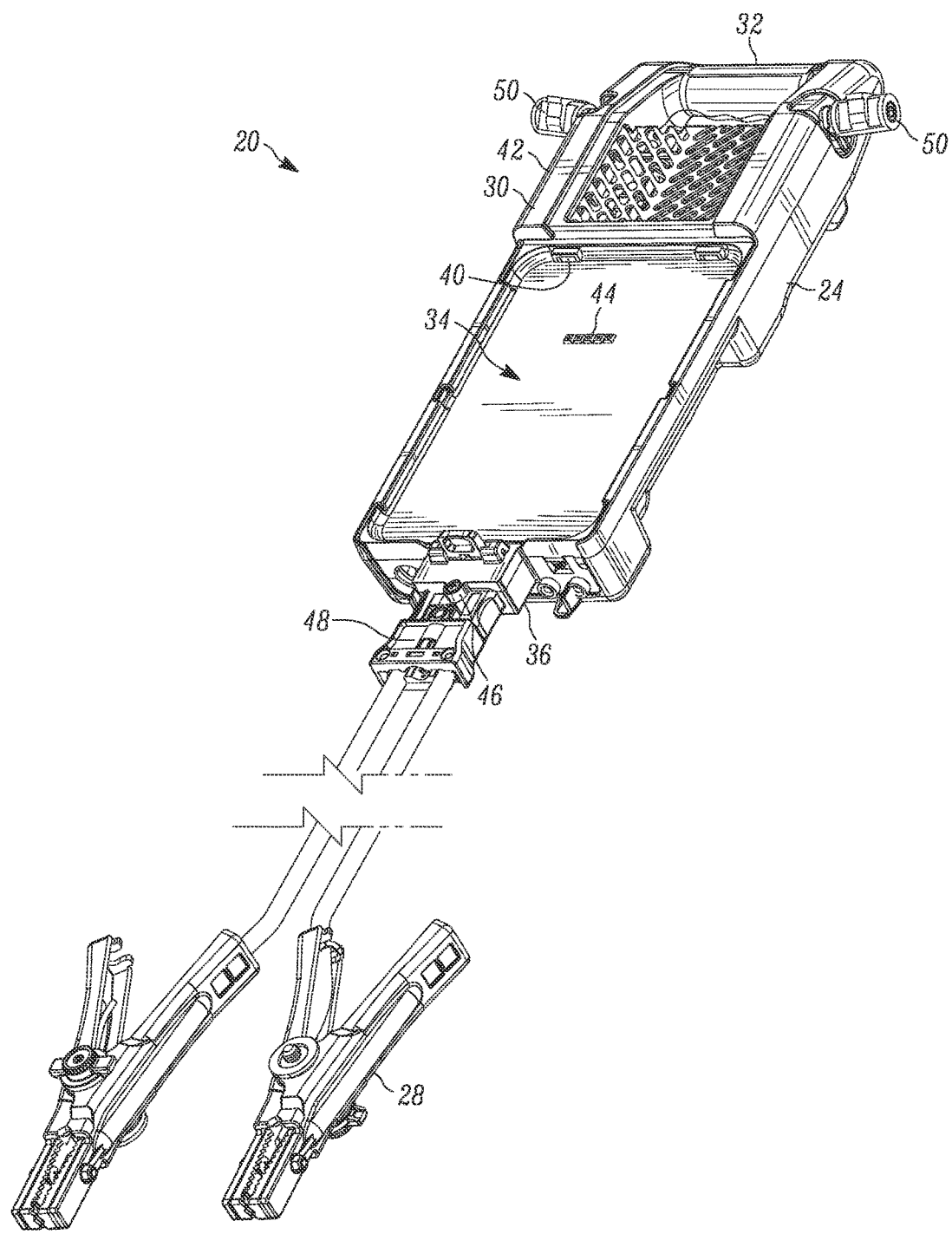
FIG. 6 is a front perspective view of the system of FIG. 3 whereby a control module has been removed.
Figure 7:
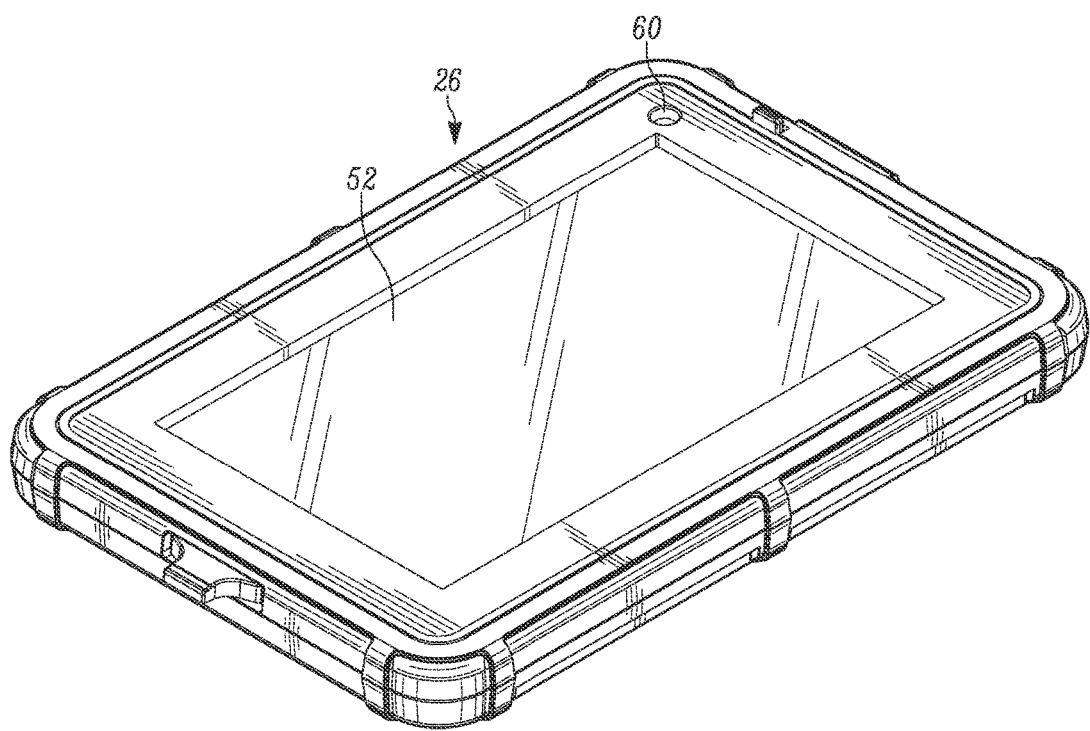
FIG. 7 is a front perspective view of a control module.
Figure 8:
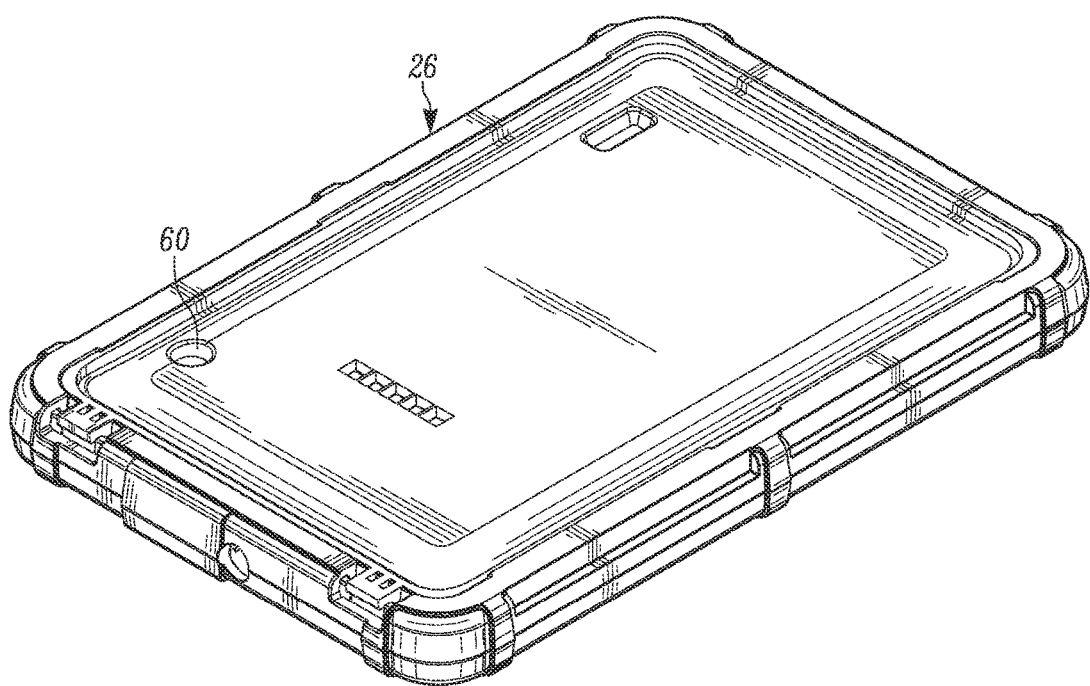
FIG. 8 is a rear perspective view of the control module of FIG. 7.
Figure 9:
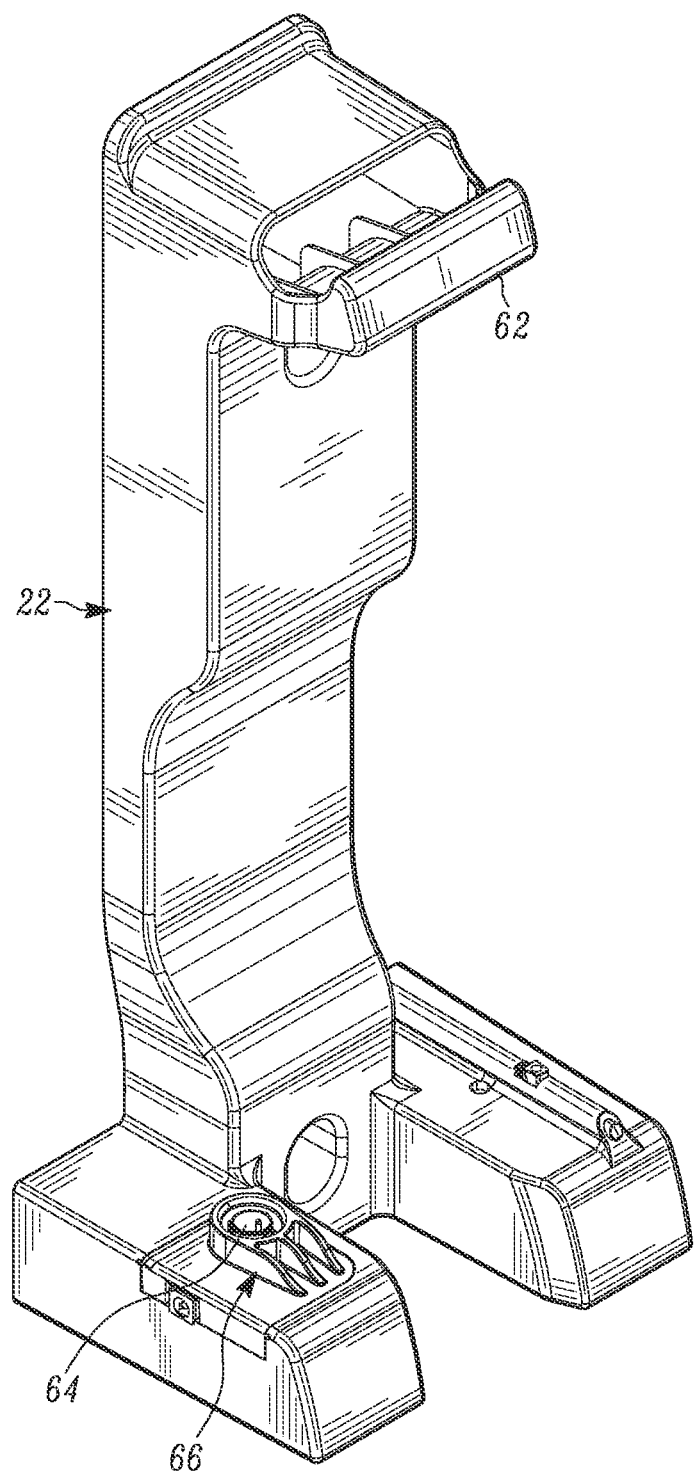
FIG. 9 is a front perspective view of a charging station.
Figure 10:
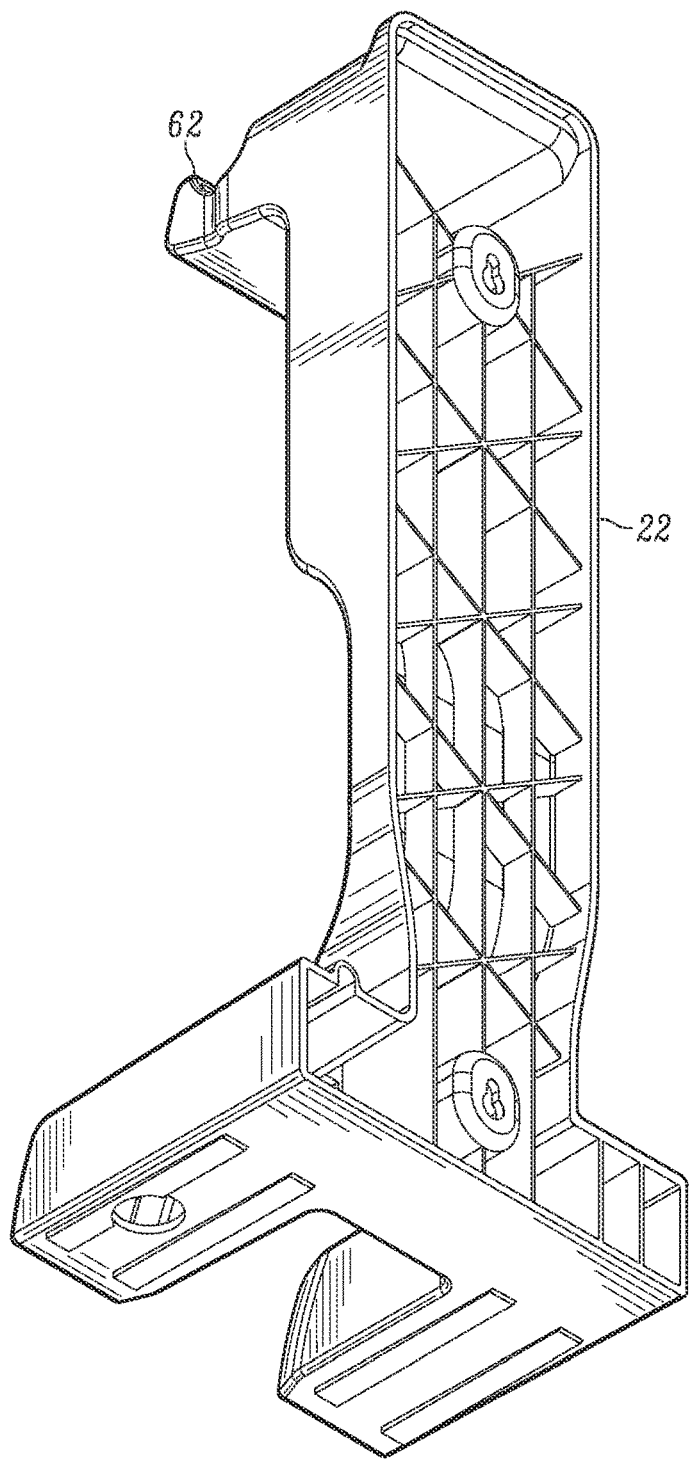
FIG. 10 is a rear perspective view of the charging station of FIG. 9.

As seen in FIGS. 1-10, the charging station 22, load module 24 and control module 26 may each be separable from one another. When used during testing, the load module 24 is coupled to components of the vehicle, such as the battery, via clamps 28 extending therefrom. As seen in FIGS. 6-8, the control module 26 may remain installed in the load module 24 and/or may be removed therefrom to control the load module 24 as well as the various tests performed via the load module 24. Further, the control module 26 may be used to control the load module 24, receive data from the load module 24, analyze the data from the load module 24, provide a user interface for the load module 24, and the like as will be understood from the description herein.

The load module 24 generally includes a main body 30, a handle 32, a portion 34 for receiving the control module, a connection 36 for coupling to external electrical connectors, as well as other features and structures. The internal electronics and wiring may include many of the features discussed in U.S. Pat. Nos. 6,061,638; 6,359,442; 6,771,073; 7,736,201; 7,990,155; and 8,823,381, in a variety of combinations. Generally, the electronics should be configured to be suitable for testing a variety of different vehicles and electrical systems for voltage, current and the like, as well as for applying loads to the vehicle's electrical system.

The load module 24 includes a portion 34 configured to receive at least a portion of the control module 26 when in a first configuration, wherein the control module 26 is physically coupled to the load module 24. In this regard, the load module 24 may include one or more protrusions, clips, openings, fasteners and the like for retaining the control module 26 to the load module 24, such as protrusions 40 (see, e.g., FIG. 6). In one form, a portion of the control module 26 is co-planar with an outermost front wall 42 of the load module 24 when positioned thereon. The control module 26 is held in place by a friction and/or snap fit and may be removed from the load module 24 by pulling on the control module 26. In another form, one or more levers or button can be engaged to release the control module from the load module.

Further, the load module 24 may include one or more electrical connectors 44 for electrically coupling the load module 24 to the control module 26. For example, such connectors 44 may be used for charging the control module 26, providing data transfer between the load module 24 and control module 26, and provide test data transfer from the control module through the load module and onto a flash memory device or computer.

In one form, one example of which is illustrated in FIGS. 5 and 6, the bottom of the load module, generally opposite the handle, includes the connection port 36 for coupling the load module 24 to external connectors or clamps 28. The connection port 36 may also be located at other areas on the load module 24. The connection port 36 may include any number of different electrical contacts for electrically coupling the load module 24 to the external connectors or clamps 28. Further, the port 36 may include other structures, such as protrusions, buttons, clamps, and the like to retain the external connectors or clamps 28 to the load module 24. In one form, buttons 46 may be used to release the electrical connectors or clamps 28 from the load module 24. Further, the system 20 may include features such as retaining screws, friction fit structures, snap fit structures, and the like.

The external connectors or clamps 28 are configured to couple the load module 24 to the vehicle's electrical system (not shown). At one end, the external clamps or connectors may be similar to standard battery terminal connectors, jumper cable ends and the like. It should be understood that other connectors may also be used. Further, the opposite end may include a plug 48 or the like for coupling to the load module 24.

Further, the load module 24 may include one or more protrusions for retaining the external connectors or clamps when not in use. For example, the load module 24 includes two protrusions 50 to which the external clamps 28 may be affixed.

The load module 24 may be configured to transfer data between the load module 24, control module 26, external computer devices, remote computer devices and the like. In this regard, the load module 24 may by physically coupled to other devices, such as via electrical connectors, CAT-5, CAT-6, USB, and the like. For example, other connectors such as current probes, small tests leads, on board diagnostics (OBD, OBDII, etc.) may be used. Further, the load module 24 may be wirelessly coupled to other devices, such as via Wi-Fi, Bluetooth, infrared (IR), RFID, and the like. In one form, the load module 24 may include a variety of different connections. For example, the load module 24 may include a Bluetooth connection to the control module 26 and then a Wi-Fi connection to a network for connecting to an external computing device, such as a cloud-based network.

The control module 26 can be used to control the load module 24, analyze data from the load module 24, transfer data from the load module 24, provide a graphical user interface, and the like. In one form, the control module 26 is in the form of a tablet-like computing device having a touchscreen 52. The touchscreen 52 can be used to control the load module 24 via a graphical user interface, as will be described in more detail below.

As noted above, in one form, the control module 26 may be separable from the load module 24. In this form, the load module 24 may be coupled to a vehicle in the engine compartment while the control module 26 is held by a user, such as while sitting in the driver's seat of the vehicle. This form permits the user to place the vehicle in a starting or cranking cycle or otherwise engage the interior controls of the vehicle while the load module 24 is coupled to the vehicle. Further, the user may interact with the control module 24 to start and stop tests, analyze data, as well as transmit data while positioned in a location remote from the load module 24. By having the control module 26 remote from the load module 24, sensitive electronics may be positioned far away from the load module 24 in case of sudden electrical surges or loads or other failures of the vehicle's electrical system. In other words, the control module 26 may avoid potential damage by being located remotely from the load module 24 and vehicle electrical system. Furthermore, by having a separable control module 26, the system 20 could be used to perform tests while the vehicle is moving.

The control module 26 may also include both wired and wireless connections for charging, data transfer and the like. For example, the control module 26 may include one or more of Wi-Fi, Bluetooth, IR, RFID, and the like. Further, charging may be accomplished via electrical contacts and/or contactless charging.

The system 20 may also include other features such as a camera 60 and other connection ports. For example, the camera 60 may be used for reading barcodes on a vehicle, on a battery, on other parts, a vehicle VIN and the like. In this regard, the barcode may be used to automatically populate information in the system about the vehicle, part, and the like. Further, connections ports and/or wireless connections can be used to interact with other vehicle diagnostic systems such as OBDI, OBDII, and the like.

The system 20 also may include the charging station 22 or cradle for holding the load module 24 and/or control module 26 when they are not being used. In one form, the charging station 22 includes a hook shaped portion 62 for cooperating with the handle 32 of the load module 24 to maintain the load module 24 in a standing position.

The charging station 22 may also include electrical contracts 64 for charging one or more of the load module 24 and control module 26 as well as providing a data connection therebetween. In one form, the charging station 22 includes contact-less and/or wireless charging.

Further, the charging station 22 may include data connections including wired connections, wireless connections and the like. These data connections may be used to transfer data from one or more of the load module 24 and control module 26 to other computer devices, networks and the like. The charging station 22 may also include a replaceable contact assembly 66 such that if the contacts between the charging station 22 and load module 24 become worn, they may be readily replaced. Further, the charging station 22 may include a light pipe so as to display charging status to an area that is readily visible to a user when the load module 24 is on the charging station 22.

The system 20 can be used for a variety of different electrical tests such as battery tests, alternator tests, starter tests, general electrical system tests and the like. For example, a number of different tests that may be accomplished through the system are discussed in U.S. Pat. Nos. 6,061,638, 6,359,442, 6,771,073, 7,736,201, 7,990,155, and 8,823,381.

In one form, the system 20 can be used to measure and determine cranking RPM during starting. When an engine is started, the battery current and voltage have variations that can be monitored. These variations can be used to determine the engine RPM during the starting phase. When the starter is energized an inrush of current occurs, which inrush pulls the battery voltage lower thus giving the testing system a trigger event to start recording the battery voltage at a known sample rate such as about 100 samples per second (10 milliseconds). In other forms, the sampling rate is about 1 to about 50 milliseconds. As the starter motor starts turning the engine, the load on the starter motor will increase each time a cylinder enters the compression cycle. When this happens the current draw will increase and the battery voltage will lower. In another form, when the current draw is at its lowest, the voltage will be at its highest. The tester can use the process detailed below to find these battery voltage low points and/or high points (voltage extremes) and determine the time between compression cycles. Using this time and the number of cylinders in the engine, an RPM value can be calculated.

In one form, the system may be coupled to the battery. In other forms, the system may be coupled to other portions of a vehicle and/or a vehicle's electrical or charging system. Further, in some forms, the vehicle may be configured to turn off many of the internal loads during testing including, but not limited to, lights, air conditioning, blowers, and other accessories. Further, the engine temperature may also be measured and used in analyzing the vehicle. For example, the temperature of the vehicle's engine may be used during the cranking RPM measurement to determine if the cranking RPM is acceptable for the specific temperature and/or if potential engine, charging, or other electrical problems may exist.

Figure 11A:
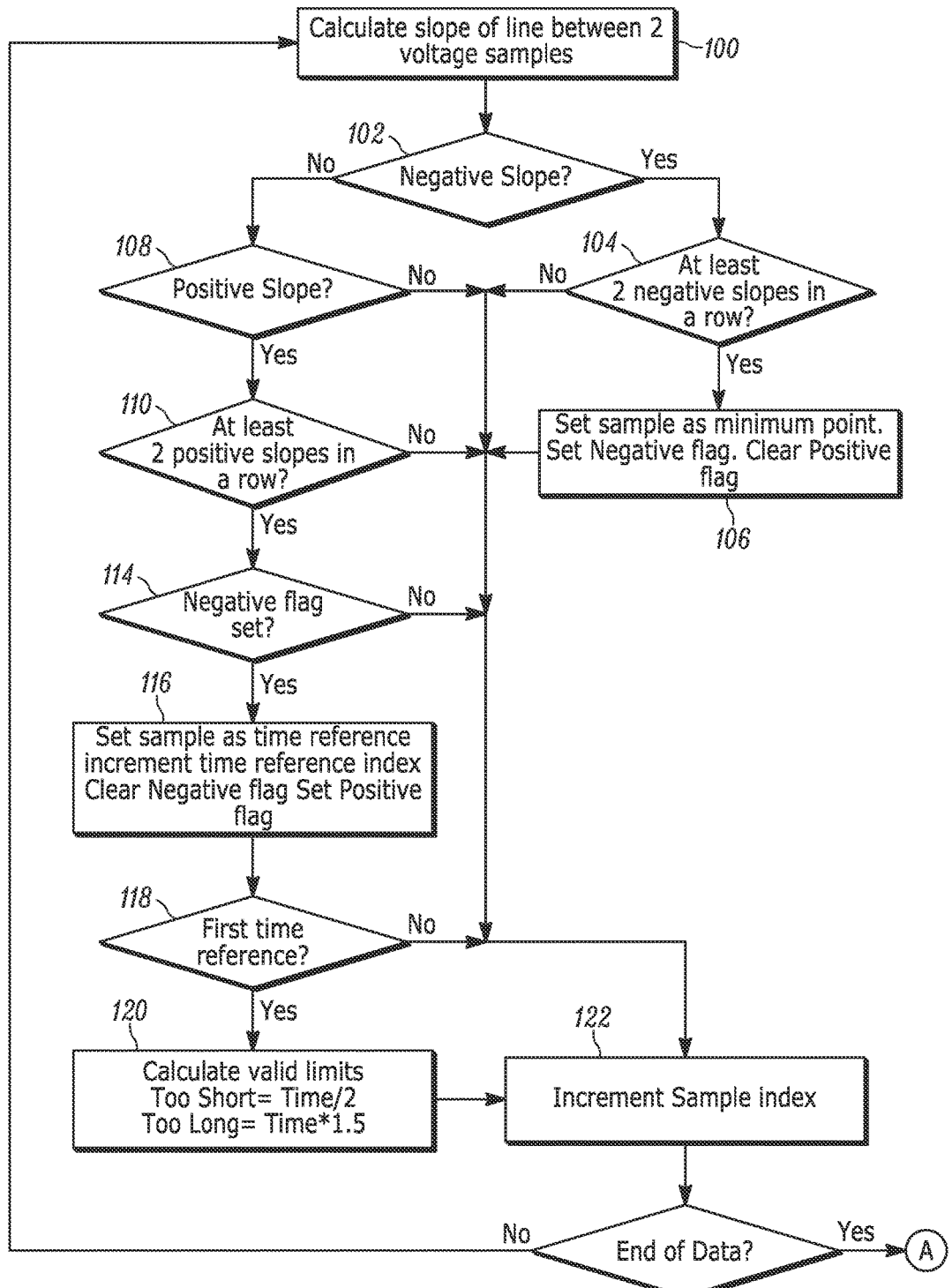
FIGS. 11A and 11B are a process flow diagram of a method for calculating RPM of a vehicle.
Figure 11B:
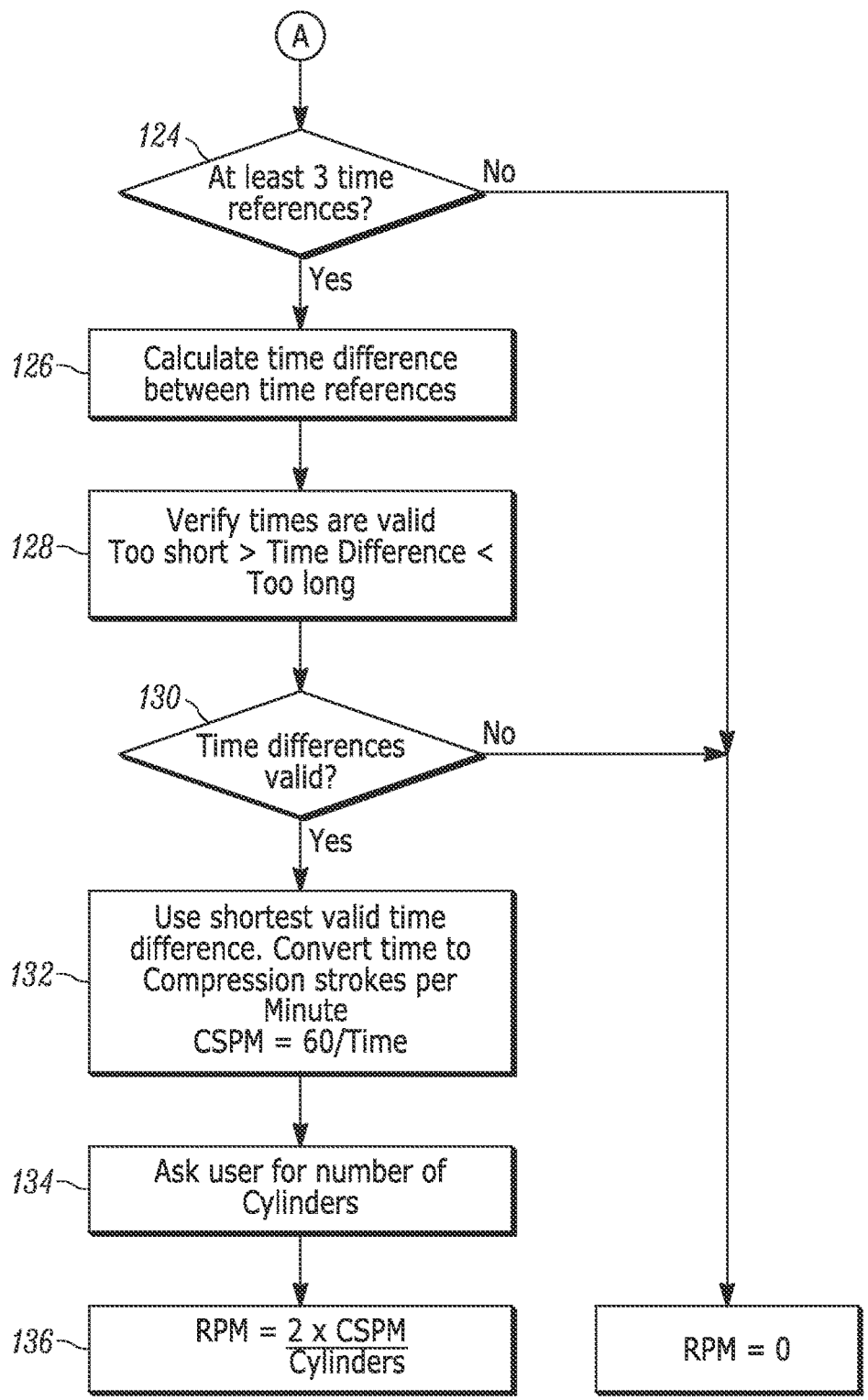

One form of cranking RPM measurement and determination is shown in FIGS. 11A and 11B where FIG. 11B is a continuation of FIG. 11A as shown by reference letter A in each figure. Referring to the flow diagram, the battery voltage versus time is measured and used to determine the cranking RPM. The method uses positive and negative flags to help determine measured voltage low points and help ignore noise and/or erroneous readings. It should be appreciated that a similar method may be used whereby the voltage high points are used in a similar manner. Therefore, the use of positive and negative slopes may be reversed in such a method. Further, both the voltage low points and high points may be used. In other words, one or both of the voltage extremes (high points and low points) may be used to determine the cranking RPM.

In one form, the slope between two adjacent voltage samples is determined at step 100. If the slope is negative, as determined at step 102, and at least two negative slopes have been found in a row, as at step 104, a negative flag is set at step 106 and any positive flags would be cleared and then used to increment the sample index. If a positive slope is found at step 108, the method looks to see if there are at least two positive slopes in a row at step 110, thereby indicating a general increase in voltage. Next, the method looks to see if a negative flag is set at 114. If a negative is set, the method marks this point as a reference index time at step 116. This would indicate that there are at least two low voltage points found so far such that the reference time is indicative of the time difference between low voltage points.

If the reference time is the first reference time for the particular test, such as at step 118, it will mark that time period as the baseline for further time settings. For example, this time period can be used to determine minimum and maximum time limits later in the process, such as at step 120. For example, too short of a time period would be the first reference time divided by two. Too long of a reference time would be the first reference time multiplied by 1.5. It should be understood that these time periods may be multiplied and divided by other values depending on the vehicle, system, and other factors involved in the test. The too short and too long time periods can be used to eliminate noise and otherwise avoid erroneous data.

The system will increment the sample index at 122 and continue operating to analyze the data during the starting cycle until the engine starts, the test is stopped, or the data otherwise runs out. In one form, after a certain number of reference times have been found, such as at least three reference times, the method continues on at step 124 to determine the cranking RPM. The reference times are determined at step 126 and then analyzed to determine if they are too short or too long at step 128. If they are valid reference times, such as at step 130, the times are further analyzed and used in the process. In one form, the shortest of the valid reference times may be used in further calculations. It should be noted that other reference times, averages of reference times, means of references times, and the like may be used in further calculations in the method.

In one form the shortest reference time is converted to compression strokes per minute at step 132. As noted above, the drop in voltage is indicative of a cylinder in the compression cycle. Therefore, the number of cylinders, such as requested or determined at step 134, may be used along with the number of compression strokes per minute to determine the cranking RPM at step 136.

It should be noted that the method may be modified to accommodate a variety of different engines including, but not limited to, 2 cycle, 4 cycle, gasoline, diesel, Wankel rotary and other engine types. The method can be modified to accommodate the number of compression cycles in a cylinder per crank revolution. This information can be input by a user, automatically populated by the system, read from a barcode or vehicle identification number, and the like.

Generally, the method analyzes the data to determine the voltage extremes, such as at least the voltage high and/or low points in the voltage measurements, by looking for when the slop changes from negative to positive (or positive to negative for high points). When this change occurs, the time is marked. The time difference between these markers of the voltage extremes is used for determining compression strokes per minute and ultimately the cranking RPM. The number of samples may vary for a particular test as well as the sampling rate and duration of the test. In one form, a test may be performed for approximately 3 seconds and approximately 300 samples may be collected. However, it should be understood that more or less samples may be collected and the test may be performed for shorter or longer durations.

Figure 12:
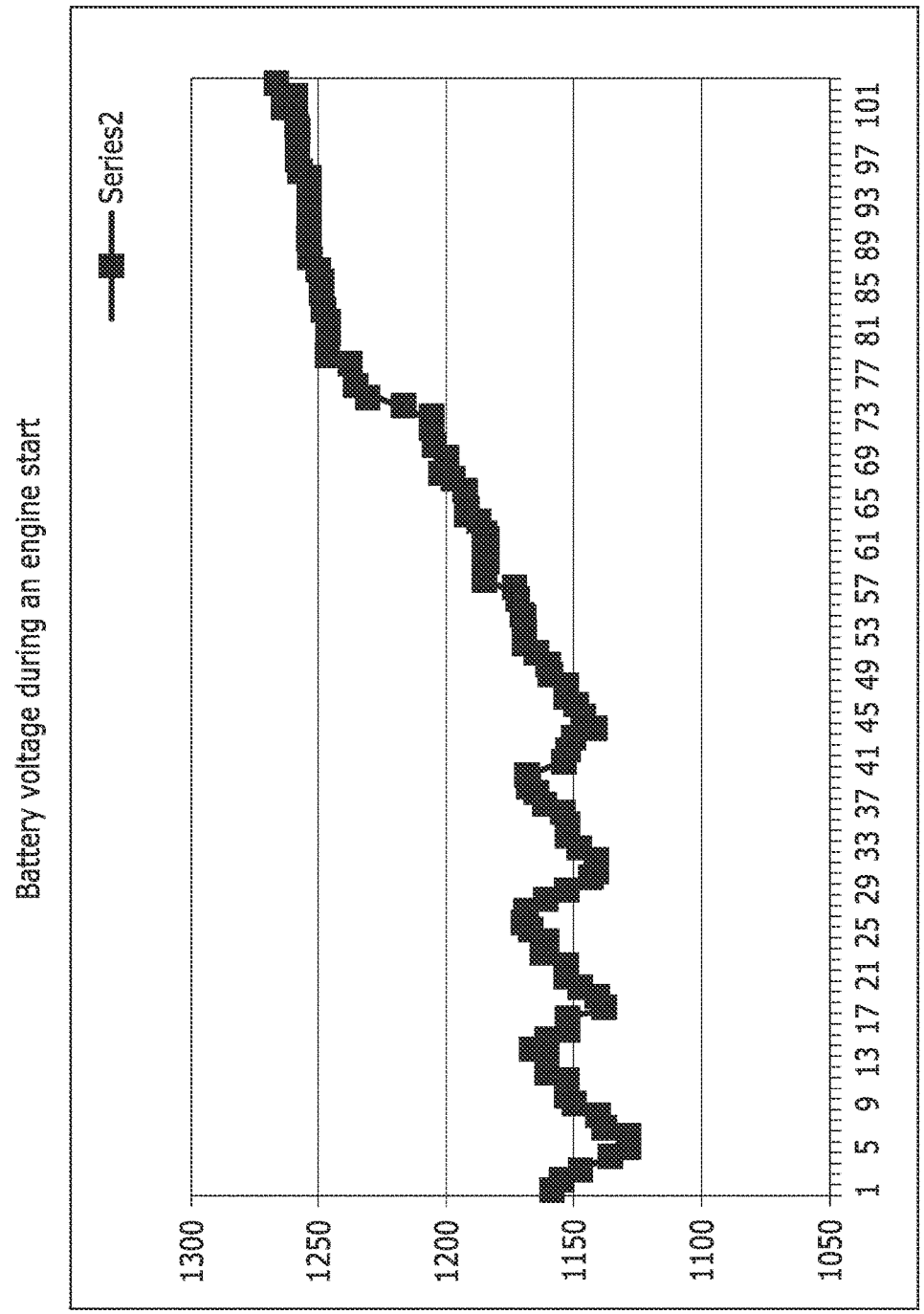
FIG. 12 is a graph illustrating battery voltage during cranking of a vehicle.
Figure 13:
FIG. 13 is an illustration of a user interface for displaying cranking RPM and other information concerning a vehicle.
Figure 14:
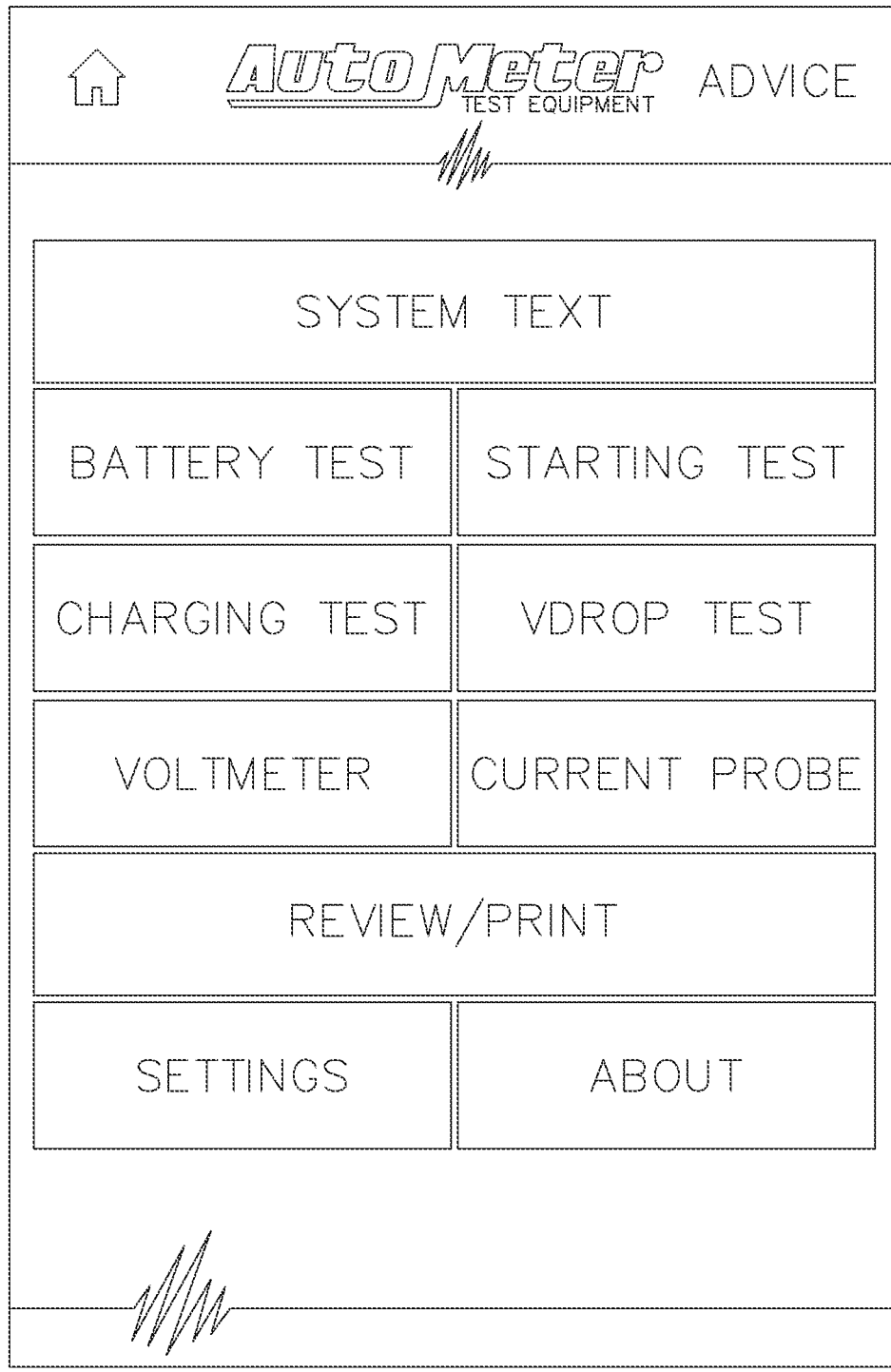
FIG. 14 is an illustration of a user interface for initiating various electrical tests for a vehicle.
Figure 15:
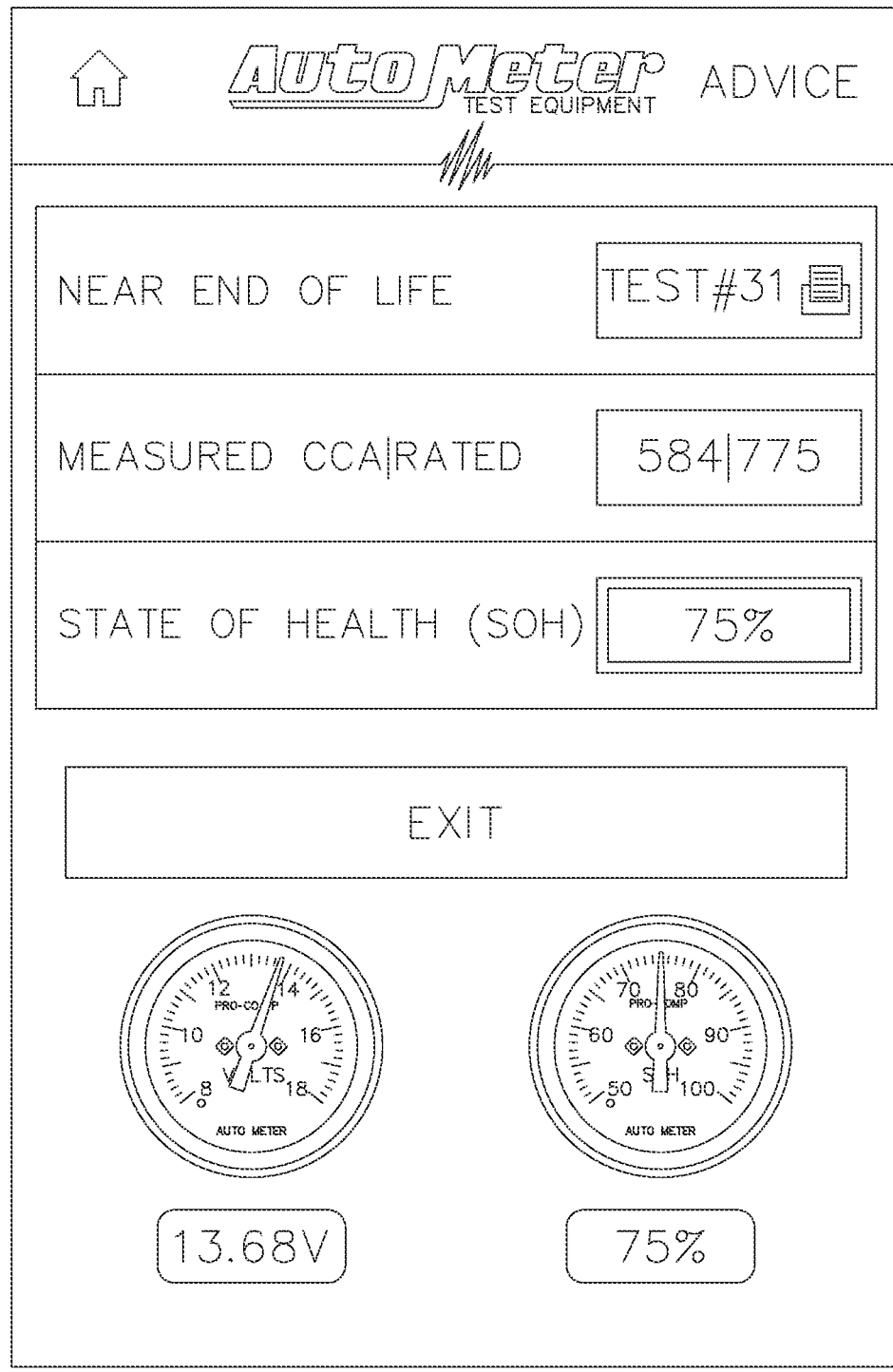
FIG. 15 is an illustration of a user interface displaying data regarding a vehicle's battery.
Figure 16:
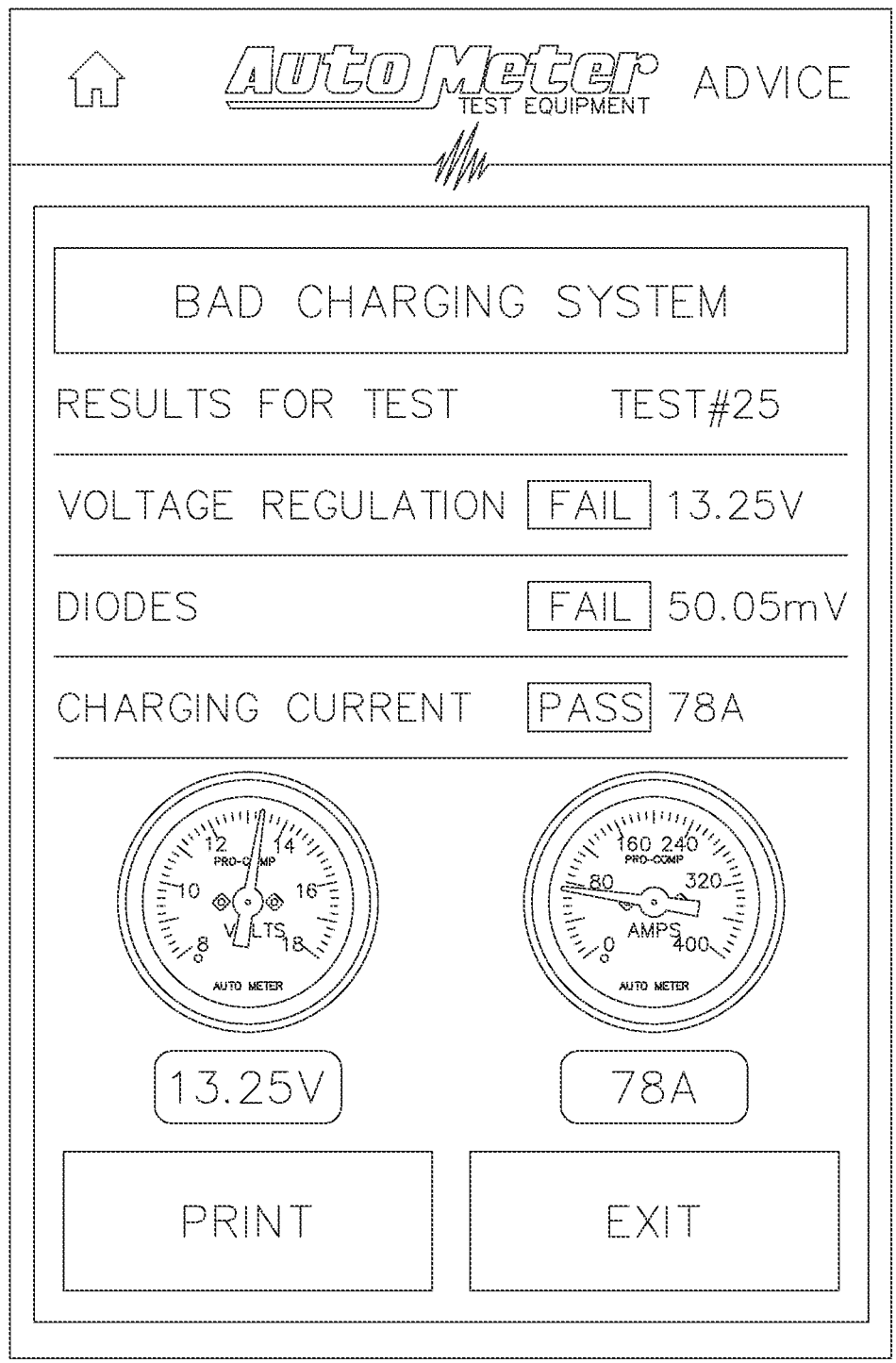
FIG. 16 is an illustration of a user interface displaying results regarding a vehicle's electrical system.

As can be seen in the graph in FIG. 12, four low voltage points were found over the various data points. The time periods between these low points were then used to calculate cranking RPM based on the number of cylinders in the particular vehicle being tested.

The cranking RPM can be used to analyze the starting performance of an engine under different conditions, temperatures, and the like. This information may be used to be indicative of the condition of a vehicle's engine, starting system, electrical system, and other components of the vehicle.

As noted above, other tests may also be performed using the testing system. For example, true load and digital pulse load testing may be performed. These tests can be used to help determine the condition of features such as the battery, starter, and/or alternator of a vehicle. Such tests and related tests are disclosed in U.S. Pat. Nos. 6,061,638, 6,359,442, 6,771,073, 7,736,201, 7,990,155, and 8,823,381.

As briefly mentioned above, the control module 26 can be used to control the various tests performed using the testing system as well as review, analyze, and/or transfer data. Examples of various portions of user interfaces for such a system are found in FIGS. 13-17. As seen in these figures, in one form, the user interface is controlled via a touchscreen. According to one form, the user interface may be controlled by a mouse, keyboard, voice control, and the like.

As can be seen in FIGS. 13-17, the user interface allows a user to start tests, stop tests, change tests, configure tests, input information about the vehicle and/or test, provide information concerning the status of the tests, provide the results of the tests, analyze the tests, and the like. Further, the user interface may provide one or more screens illustrating to a user how to configure the system, vehicle and any other associate components for a specific test.

Further, the results of the various tests may be provided while the tests are taking place and/or subsequent to the tests being completed. In one form, the data from the tests may be provided in an analog view, such as on an analog dial, as well as a digital view, such as in a numerical readout. In this form, the data appears in a form similar to the physical dials and gauges that may be located in an interior of a vehicle.

As mentioned above, data from at least one of the control module 26, load module 24, and/or charging station 22 may be transmitted to a local and/or remote location, such as a local, and/or remote computing device. For example, in one form, data may be transferred to a cloud-based system for storage and/or further analysis.

Figure 17:
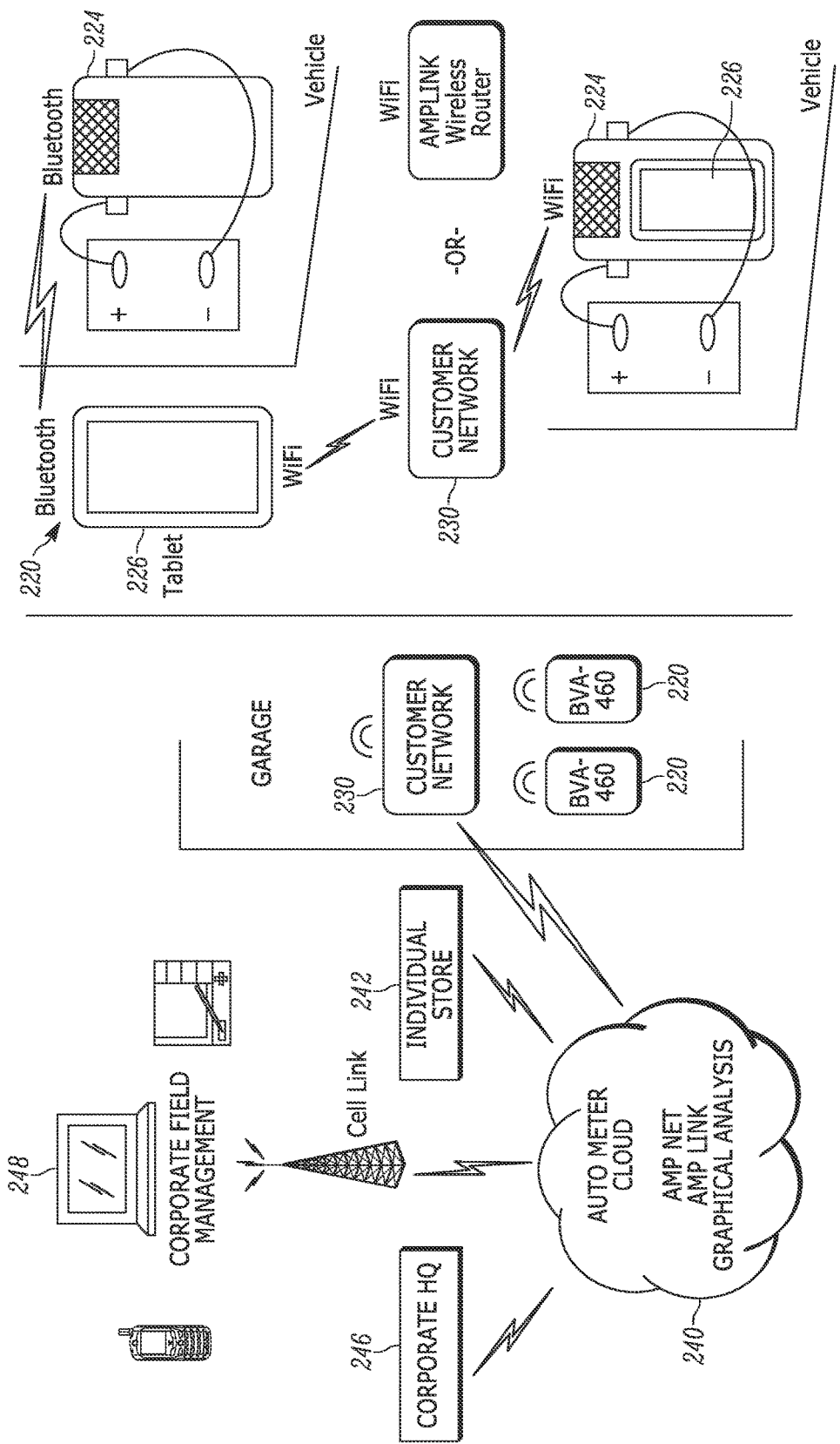
FIG. 17 is a diagram showing data communication between different devices and systems regarding vehicle tests and results.
Figure 18:
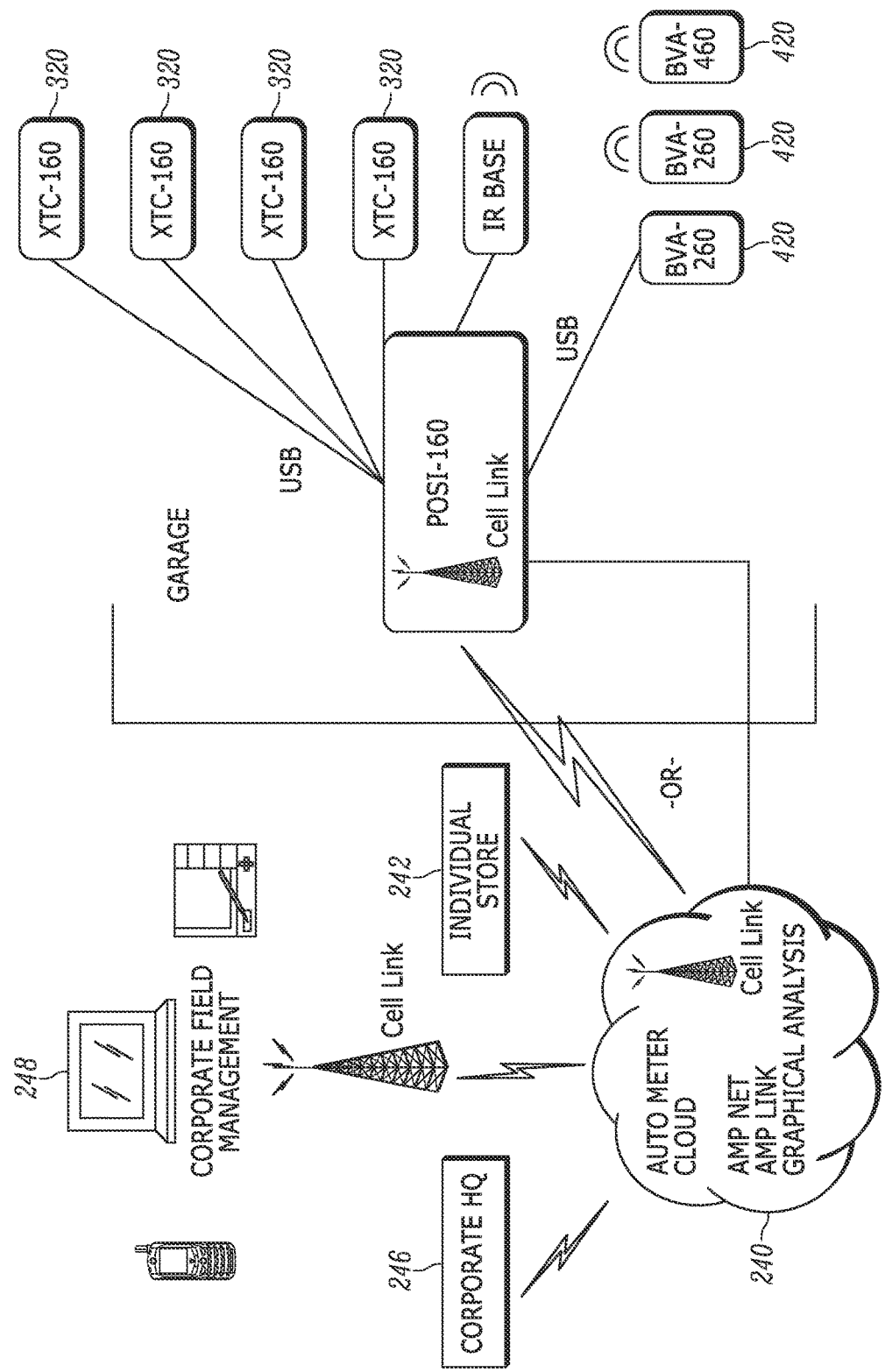
FIG. 18 is a diagram showing additional data communication between different devices and systems regarding vehicle tests and results.

As seen in FIGS. 17 and 18, one or more testing systems described herein, such as shown as BV A-460, may transfer data to a customer network, such as in a local garage or mechanic, and/or another data storage location and computing device. The customer network can then transfer the data to a cloud type system, such as shown as Auto Meter Cloud (AMP NET, AMP LINK). Further, corporate offices, other stores, and other locations may have access to the data in the cloud-based system to further review and/or analyze the data, as well as aggregate the data with other garage locations.

Referring to FIG. 17, in one form, the testing system 220 can include a load module 224 that connects via Bluetooth to a control module 226, such as a tablet. The control module 226 or tablet may be located either remotely from or be connected to the load module 224. The control module 226 or tablet may then connect via Wi-Fi to the customer's network 230. As seen in FIG. 17, multiple testing systems 220 can connect to the customer network 230.

The customer network 230 can then connect to a cloud-based system 240. The cloud-based system can connect multiple stores 242, corporate headquarters 248, and/or field management 248. In this form, data from a variety of locations can be provided to monitor fleets, individual locations, as well as have a centralized database of the status of a variety of different vehicles.

According to one form, as shown in FIG. 18, other electrical testing systems 320,420, such as shown as XTC-160, BV A-260, may also transmit data in a similar manner. These systems 320,420 may be connected to the same and/or a different network as the testing systems 220 described herein, such as shown as BV A-460. Any of these testing systems may connect via wired and/or wireless methods to the cloud-based system. For example, such connections may include, but are not limited to, USB, IR, Wi-Fi, cellular, and the like.

Such data may include battery, starter, alternator, and/or other electrical system information. This data can be transferred to a system such as the AMPnet Automotive Test Equipment Software and Data Service. The data can be aggregated, analyzed, and displayed graphically for multiple levels of hierarchy based access. Multiple garage sites can be serviced simultaneously and all reporting can be real-time based and/or updated as required.

The data from the system can be aggregated and/or used for preparing charts, comparisons, correlations, and the like. For example, the data can be used to correlate test results with sales of batteries, alternators, starters, and other related components. Such information can be used to compare different stores or retail locations.

The matter set forth in the foregoing description and accompanying drawings is offered by way of illustration only and not as a limitation. While particular embodiments have been shown and described, it will be apparent to those skilled in the art that changes and modifications may be made without departing from the broader aspects of applicants' contribution. The actual scope of the protection sought is intended to be defined in the following claims when viewed in their proper perspective based on the prior art.

What is claimed is:

1. A method for measuring and determining cranking RPM of a vehicle, the method comprising the steps of:
 measuring current and/or voltage of a portion of an electrical system of the vehicle at a load module during at least a portion of a starting cycle, the load module configured to apply loads to the vehicle's electrical system; and
 in one or more computing devices,
  determining a first extreme current and/or voltage point of the portion of the electrical system after the starting cycle has begun to designate a first reference time, determining a second current and/or extreme voltage point of the portion of the electrical system after the first reference time to create a second reference time, determining an amount of time between the first and second reference times, determining a number of compression strokes per minute based on the amount of time between the first and second reference times, and determining the cranking RPM of the vehicle based on the number of compression strokes per minute and number of cylinders in the vehicle, wherein the determining steps are performed in a control module located remotely from the load module.

2. The method of claim 1 wherein the current and/or voltage is measured at a sampling rate of at least about 100 samples per second.

3. The method of claim 1 further comprising wirelessly transferring data between the load module and the control module.

4. The method of claim 1 wherein the first and second current and/or voltage extremes are high current and/or voltage points.

5. The method of claim 1 wherein the first and second current and/or voltage extremes are low current and/or voltage points.

6. The method of claim 1 wherein the first and second current and/or voltage extremes are high and low current and/or voltage points.

7. The method of claim 1 wherein a plurality of reference times are determined and the cranking RPM is determined based on a shortest valid reference time.

8. The method of claim 1 wherein the load module is connected to the starter and the battery.

9. A system for analyzing cranking RPM of a vehicle comprising:

a testing system configured to be coupled to at least a portion of an electrical system of the vehicle, wherein the testing system comprises a load module and a control module, the testing system is configured to:

measure current and/or voltage of the portion of the electrical system at the load module during at least a portion of a starting cycle of the vehicle, the load module configured to apply loads to the vehicle's electrical system, determine a first extreme current and/or voltage point of the portion of the electrical system after the starting cycle has begun to designate a first reference time, determine a second extreme current and/or voltage point of the portion of the electrical system after the first reference time to create a second reference time, determine an amount of time between the first and second reference times, determine a number of compression strokes per minute based on the amount of time between the first and second reference times, and determine the cranking RPM of the vehicle based on the number of compression strokes per minute and number of cylinders in the vehicle, wherein the determining steps are performed in a control module located remotely from the load module.

10. The system of claim 9 further comprising a computing device located remotely from the testing system and configured to receive data from the testing system indicative of the cranking RPM of the vehicle, the computing device compiling the data from the testing system indicative of the cranking RPM of the vehicle to provide with data from other vehicles indicative of cranking RPM of the other vehicles.

11. The system of claim 9 further comprising a plurality of testing systems, the computing device configured to receive data from individual ones of the plurality of testing systems and compile data on a plurality of vehicles from the plurality of testing systems.

12. The system of claim 9 wherein the testing system comprises:

electrical leads coupled to the load module and extending therefrom for coupling to at least a portion of an electrical system of the vehicle; and the control module coupled to the load module for transmitting data therebetween, the control module being physically coupled to the load module in a first configuration and physically disconnected from the load module in a second configuration.

13. The system of claim 12 wherein the control module and load module are wirelessly coupled to one another to transmit data therebetween.

14. The system of claim 12 wherein the control module and load module are coupled to one another via at least one of Wi-Fi, Bluetooth, infrared, USB, and RFID.

15. The system of claim 12 wherein the control module and load module are configured to transmit data therebetween when in the first configuration and when in the second configuration.

16. The system of claim 9 further comprising a remote computing device, wherein the testing system transmits data to the remote computing device.

17. The system of claim 16 wherein the testing system is further configured to measure and transmit data to the remote computing device concerning at least one of a battery test, alternator test, and a starter test on the vehicle.

18. The system of claim 9 wherein a plurality of reference times are determined and the cranking RPM is determined based on a shortest valid reference time.

19. The system of claim 9 wherein the load module includes leads configured to be connected to the starter and leads configured to be connected to the battery.

* * * * *